United States Patent
Chen

(10) Patent No.: US 10,602,637 B2
(45) Date of Patent: Mar. 24, 2020

(54) CONVENIENT TWO STEP INNER SLIDING RAIL MOUNTING STRUCTURE FOR SERVER SLIDING RAIL ASSEMBLY

(71) Applicant: Gslide Corporation, New Taipei (TW)

(72) Inventor: Yung-Liang Chen, New Taipei (TW)

(73) Assignee: Gslide Corporation, New Taipei (TW)

( * ) Notice: Subject to any disclaimer, the term of this patent is extended or adjusted under 35 U.S.C. 154(b) by 0 days.

(21) Appl. No.: 16/149,593

(22) Filed: Oct. 2, 2018

(65) Prior Publication Data

US 2019/0373757 A1 Dec. 5, 2019

(30) Foreign Application Priority Data

Jun. 1, 2018 (CN) .................................. 107118943

(51) Int. Cl.
*H05K 7/18* (2006.01)
*A47B 88/43* (2017.01)
*A47B 88/483* (2017.01)

(52) U.S. Cl.
CPC .............. *H05K 7/183* (2013.01); *A47B 88/43* (2017.01); *A47B 88/483* (2017.01); *A47B 2210/0002* (2013.01)

(58) Field of Classification Search
CPC ...... H05K 7/183; A47B 88/43; A47B 88/483; A47B 88/423
See application file for complete search history.

(56) References Cited

U.S. PATENT DOCUMENTS

| | | |
|---|---|---|
| 7,703,734 B2 | 4/2010 | Chen et al. |
| 8,602,255 B2 | 12/2013 | Lin et al. |
| 9,125,489 B2 | 9/2015 | Chen et al. |
| 9,370,120 B2 | 6/2016 | Chen et al. |
| 9,377,049 B2 | 6/2016 | Hwang |
| 9,480,183 B2 | 10/2016 | Chen et al. |
| 9,670,956 B2 | 6/2017 | Judge |
| 9,801,467 B2 | 10/2017 | Chen et al. |
| 9,854,908 B1 | 1/2018 | Tang |

(Continued)

FOREIGN PATENT DOCUMENTS

| | | |
|---|---|---|
| TW | I305138 | 5/2008 |
| TW | M427756 | 4/2012 |

(Continued)

OTHER PUBLICATIONS

U.S. Appl. No. 16/149,833, filed Oct. 2, 2018.

*Primary Examiner* — Daniel J Rohrhoff
(74) *Attorney, Agent, or Firm* — Gardner, Linn, Burkhart & Ondersma LLP

(57) ABSTRACT

A convenient two-step inner sliding rail mounting structure is provided for a server sliding rail assembly in which a front bracket at a front end of an outer rail is connected to a front end of a front bracket auxiliary sliding rail that has an opposing rear end slidably inserted into an outer rail reinforcement rail. The rear end of the front bracket auxiliary sliding rail is connected to a spring plate that is connected with an outer rail pull-out control member having a stopper portion and a press portion that allows a user to release the stopper portion from the outer rail reinforcement rail so that the outer rail reinforcement rail can be pulled out of the front bracket auxiliary sliding rail to permit the insertion of the inner sliding rail into the outer rail.

1 Claim, 11 Drawing Sheets

(56) References Cited

U.S. PATENT DOCUMENTS

| | | | |
|---|---|---|---|
| 9,854,911 B1 | 1/2018 | Chang | |
| 9,918,404 B1* | 3/2018 | Chen | A47B 88/43 |
| 10,051,759 B1* | 8/2018 | Chen | A47B 57/545 |
| 10,278,498 B2* | 5/2019 | Chen | H05K 7/1489 |
| 2003/0111436 A1 | 6/2003 | Basinger et al. | |
| 2008/0078899 A1* | 4/2008 | Chen | A47B 88/43 |
| | | | 248/220.21 |
| 2009/0261699 A1 | 10/2009 | Yu et al. | |
| 2011/0135224 A1 | 6/2011 | Chen et al. | |
| 2011/0192946 A1* | 8/2011 | Yu | H05K 7/1489 |
| | | | 248/222.11 |
| 2011/0240580 A1 | 10/2011 | Yu et al. | |
| 2012/0193489 A1 | 8/2012 | Yu et al. | |
| 2014/0070064 A1* | 3/2014 | Chen | A47B 88/43 |
| | | | 248/221.11 |
| 2015/0201754 A1* | 7/2015 | Chen | A47B 96/025 |
| | | | 248/219.3 |
| 2017/0079427 A1* | 3/2017 | Chen | A47B 88/423 |
| 2017/0303426 A1* | 10/2017 | Chen | A47B 96/07 |
| 2018/0098626 A1 | 4/2018 | Chen et al. | |
| 2018/0220797 A1* | 8/2018 | Chen | A47B 88/423 |
| 2018/0360212 A1* | 12/2018 | Chen | A47B 88/423 |
| 2019/0059585 A1* | 2/2019 | Chen | A47B 57/38 |
| 2019/0274427 A1* | 9/2019 | Chen | A47B 57/485 |
| 2019/0298060 A1* | 10/2019 | Chen | A47B 88/49 |

FOREIGN PATENT DOCUMENTS

| | | |
|---|---|---|
| TW | I517807 | 3/2014 |
| TW | I489931 | 6/2015 |
| TW | M509508 | 9/2015 |
| TW | M516294 | 1/2016 |
| TW | I573518 | 3/2017 |
| TW | I589214 | 4/2017 |
| TW | I608780 | 12/2017 |

* cited by examiner

US 10,602,637 B2

CONVENIENT TWO STEP INNER SLIDING RAIL MOUNTING STRUCTURE FOR SERVER SLIDING RAIL ASSEMBLY

FIELD OF THE INVENTION

The present invention relates to server sliding rail technology and more particularly, to an inner sliding rail mounting structure for server sliding rail assembly, which allows an outer rail to be pulled out for a distance to expose to the outside of the server rack.

BACKGROUND OF THE INVENTION

FIG. 1 illustrates server boxes 40' mounted in a server rack 4' with two-stage sliding rail assemblies 9. When installed, respective outer rails 91 of the sliding rail assemblies 9 are fixedly mounted in the server rack 4', and then the inner sliding rails (not shown) that are affixed to the respective server box 40' are respectively inserted into the respective outer rails 91. However, when wishing to install an additional server box 40' in a space 400' between two installed server boxes 40' in the server rack 4', it will be difficult to accurately insert the inner sliding rails (not shown) with this additional server box 40' into the outer rails in the server rack 4' between the two installed server boxes 40' because of the occurrence of a blind spot where the front ends of the out rails are covered by the two installed servo boxes 40'.

Further, Taiwan Patent I589214, entitled "Detachable inner sliding rail mounting structure for server sliding rail assembly," discloses the technical field of mounting and dismounting of the inner sliding rails of a server sliding rail assembly.

SUMMARY OF THE INVENTION

An object of the present invention to provide convenient two-step inner sliding rail mounting structure for server sliding rail assembly, which can unlock an outer rail reinforcement rail through a simple pressing operation, allowing the outer rail to be moved with the outer rail reinforcement rail to expose it to the outside of the server rack for quick installation of the inner sliding rail.

To achieve this and other objects of the present invention, a convenient two-step inner sliding rail mounting structure for server sliding rail assembly comprises an outer rail, an outer rail reinforcement rail, and an inner sliding rail. A front bracket at the front end of the outer rail is connected to a front end of a front bracket auxiliary sliding rail that has an opposing rear end thereof slidably inserted into an outer rail reinforcement rail. The rear end of the front bracket auxiliary sliding rail is connected with one end of a spring plate that has an opposite end thereof connected with an outer rail pull-out control member. The outer rail pull-out control member has a stopper portion adapted for stopping against a front end of an upper wall of the outer rail reinforcement rail, and a press portion connected to a front side of the stopper portion for pressing by a user. Pressing the press portion releases the stopper portion from the front end of the upper wall of the outer rail reinforcement rail, thus allowing the outer rail reinforcement rail to be pulled out of the front bracket auxiliary sliding rail to expose the front end of the outer rail to the outside of the front end of the server rack for the insertion of the inner sliding rail into the outer rail.

These and other objects, advantages and features of the invention will become apparent upon review of the following specification in conjunction with the drawings.

DETAILED DESCRIPTION OF THE PREFERRED EMBODIMENTS

Figure 1:
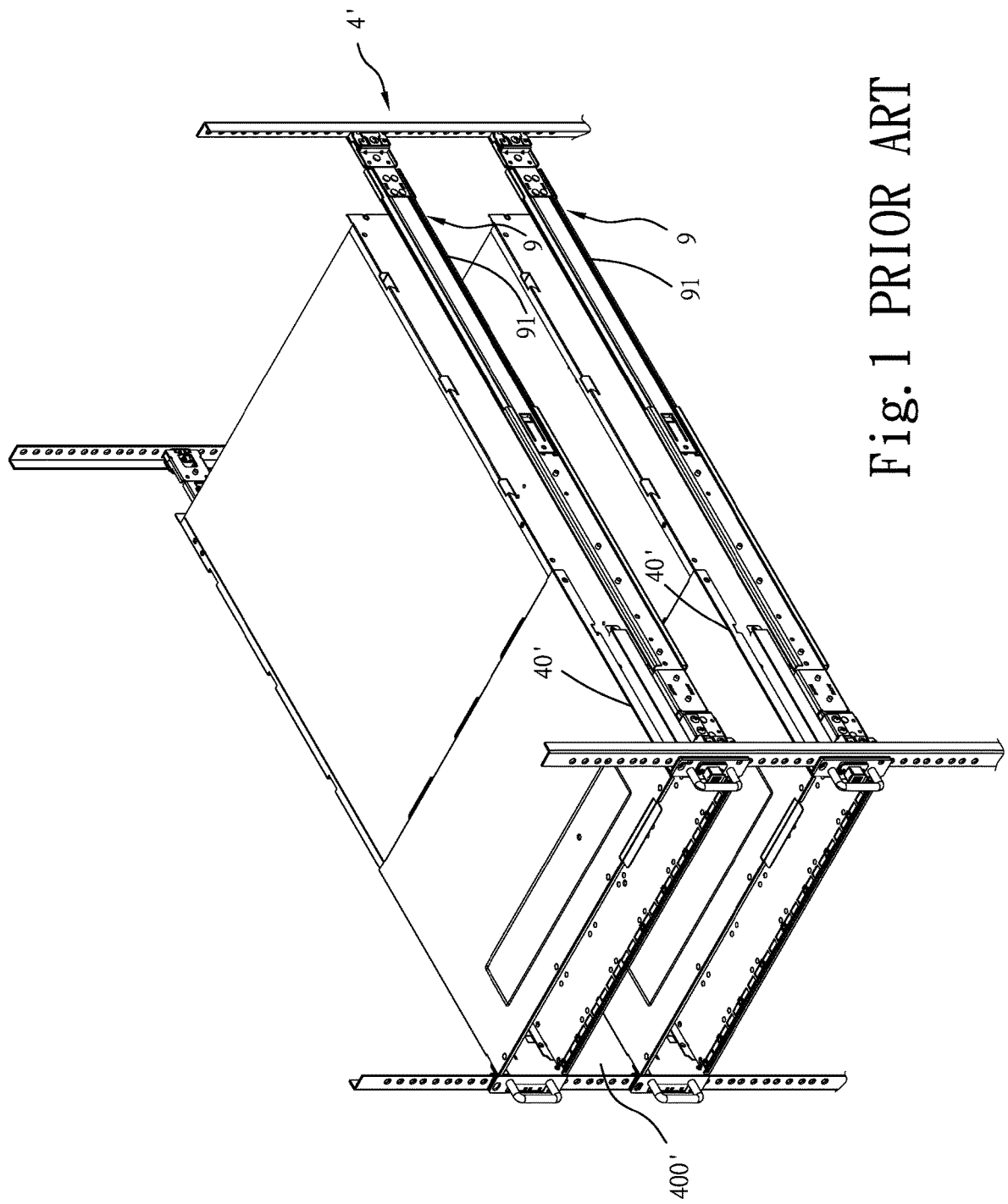
FIG. 1 is a top perspective view of two server boxes mounted in a prior art server rack.
Figure 2:
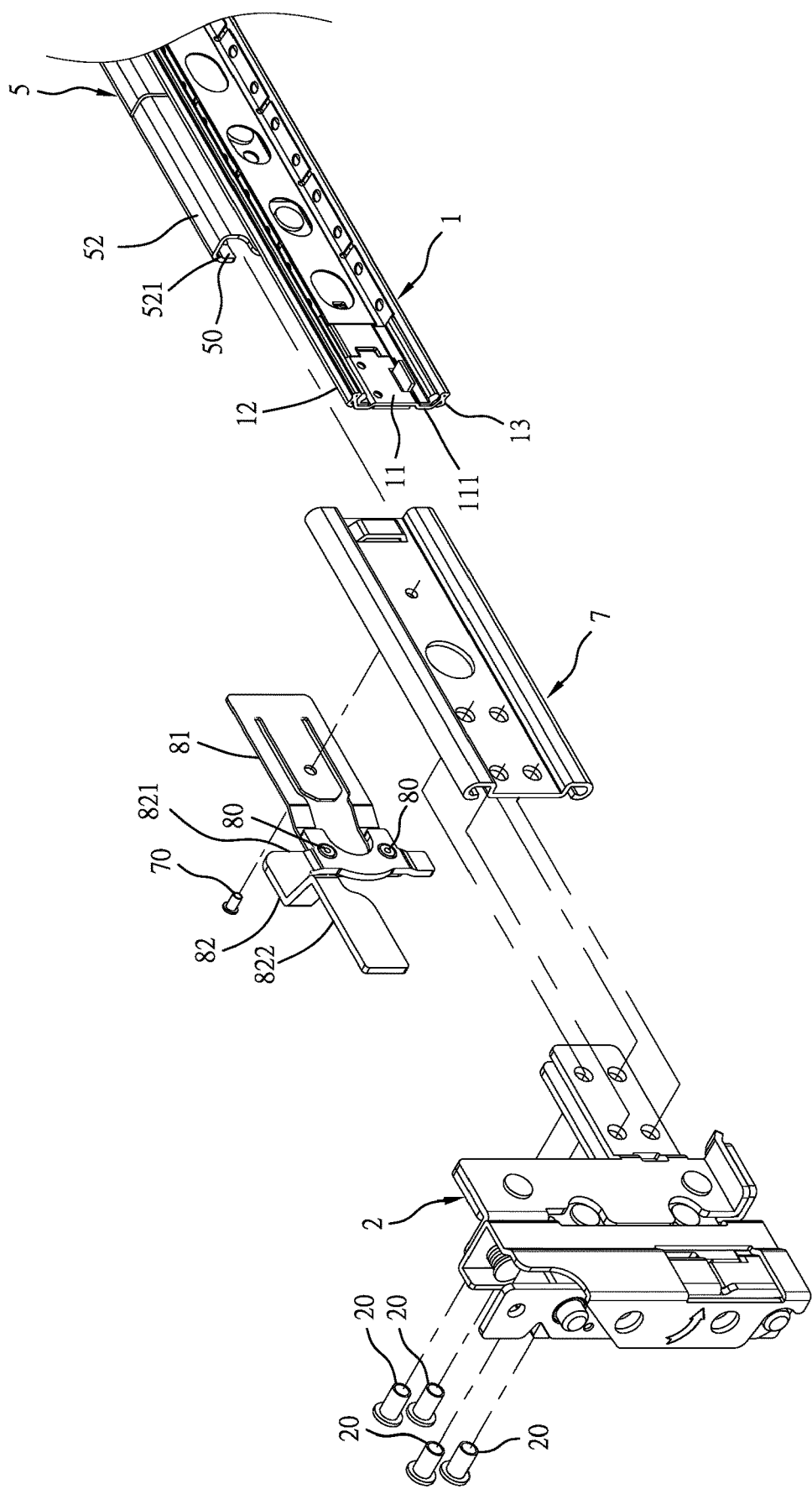
FIG. 2 is an exploded perspective view of an outer rail, a front bracket auxiliary sliding rail, a spring plate, an outer rail pull-out control member and a front bracket of a convenient two-step inner sliding rail mounting structure for server sliding rail assembly in accordance with the present invention.
Figure 3:
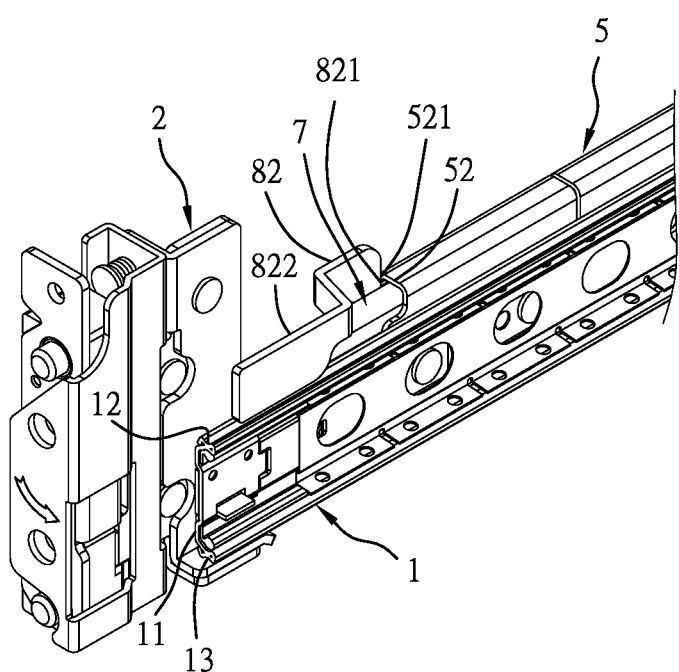
FIG. 3 is a perspective view of the outer rail, the front bracket auxiliary sliding rail, the spring plate, the outer rail pull-out control member and the front bracket in an assembled configuration.
Figure 4:
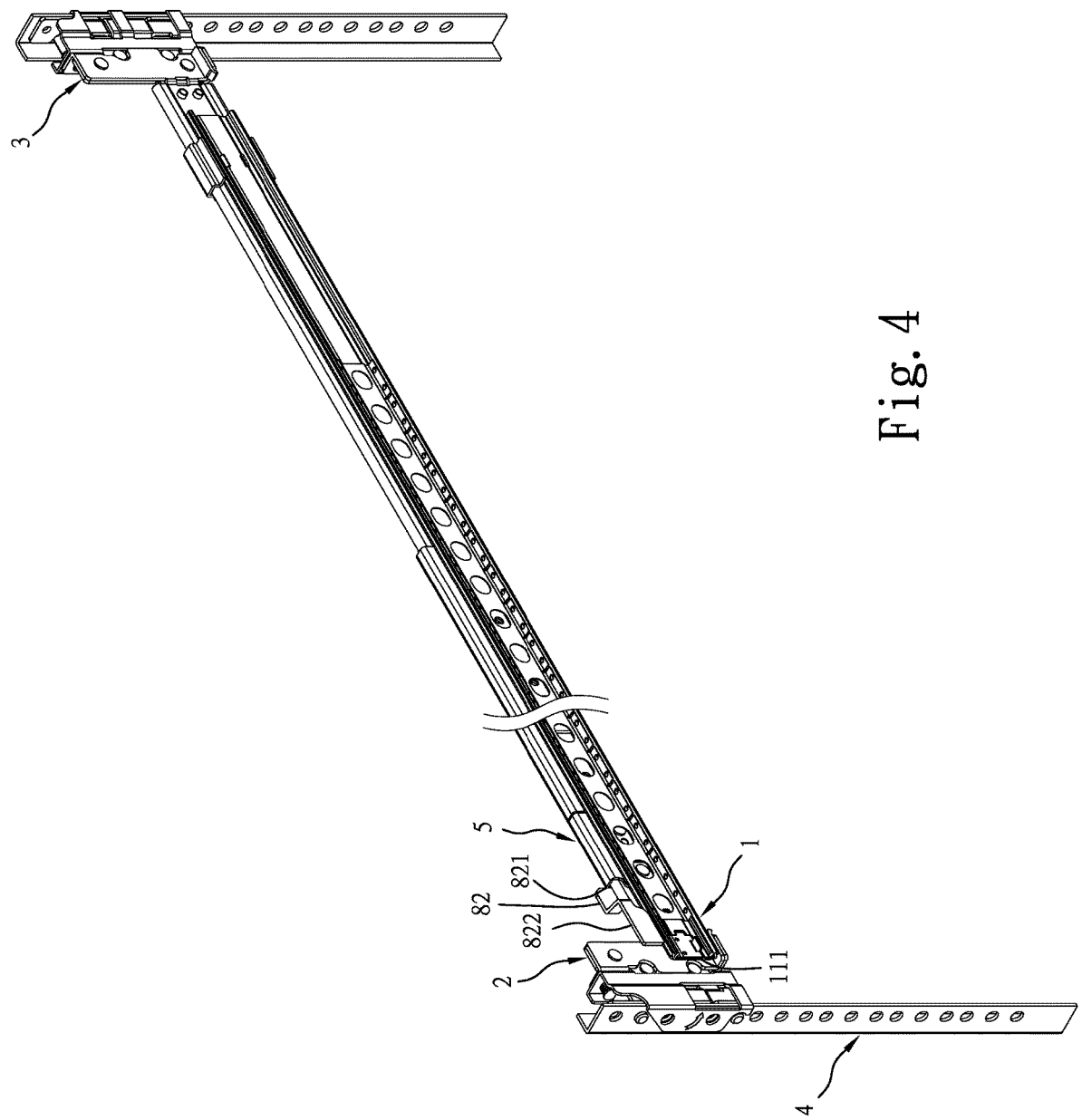
FIG. 4 is a perspective view of the two-step inner sliding rail mounting structure installed in the server rack through the front bracket and the rear bracket.
Figure 5:
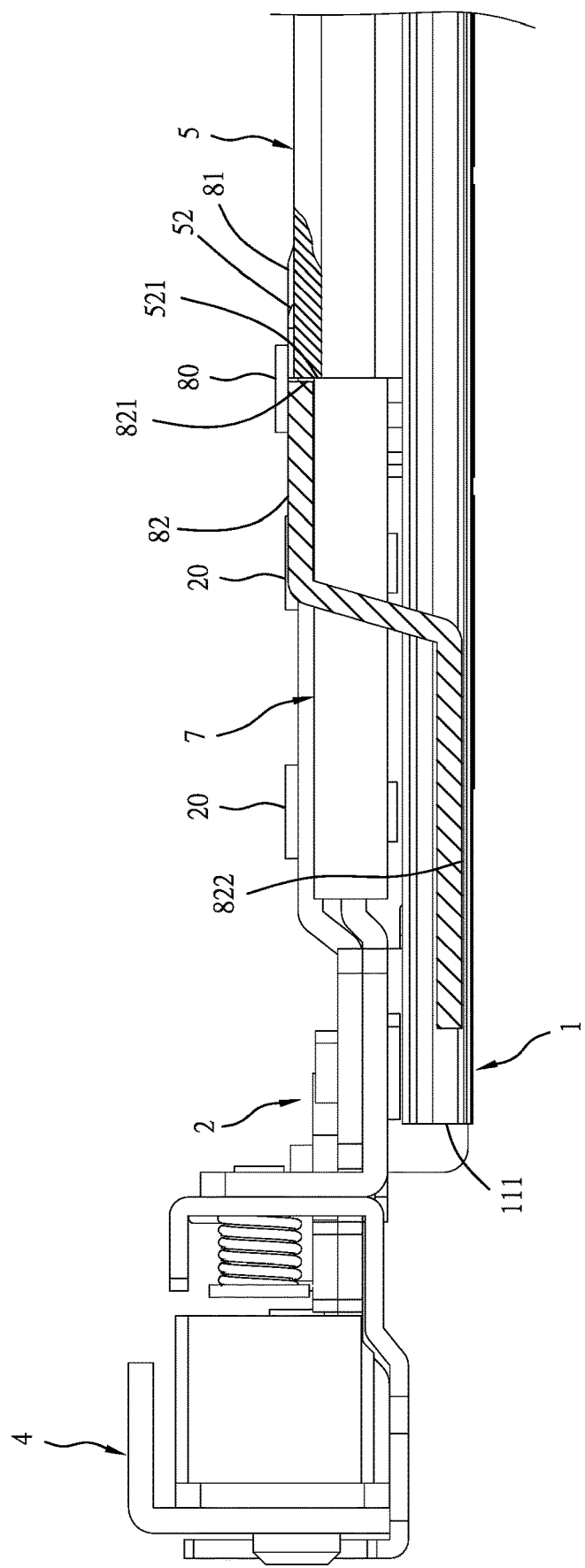
FIG. 5 is an enlarged top sectional view of a portion of the mounting structure and server rack of FIG. 4.
Figure 9:
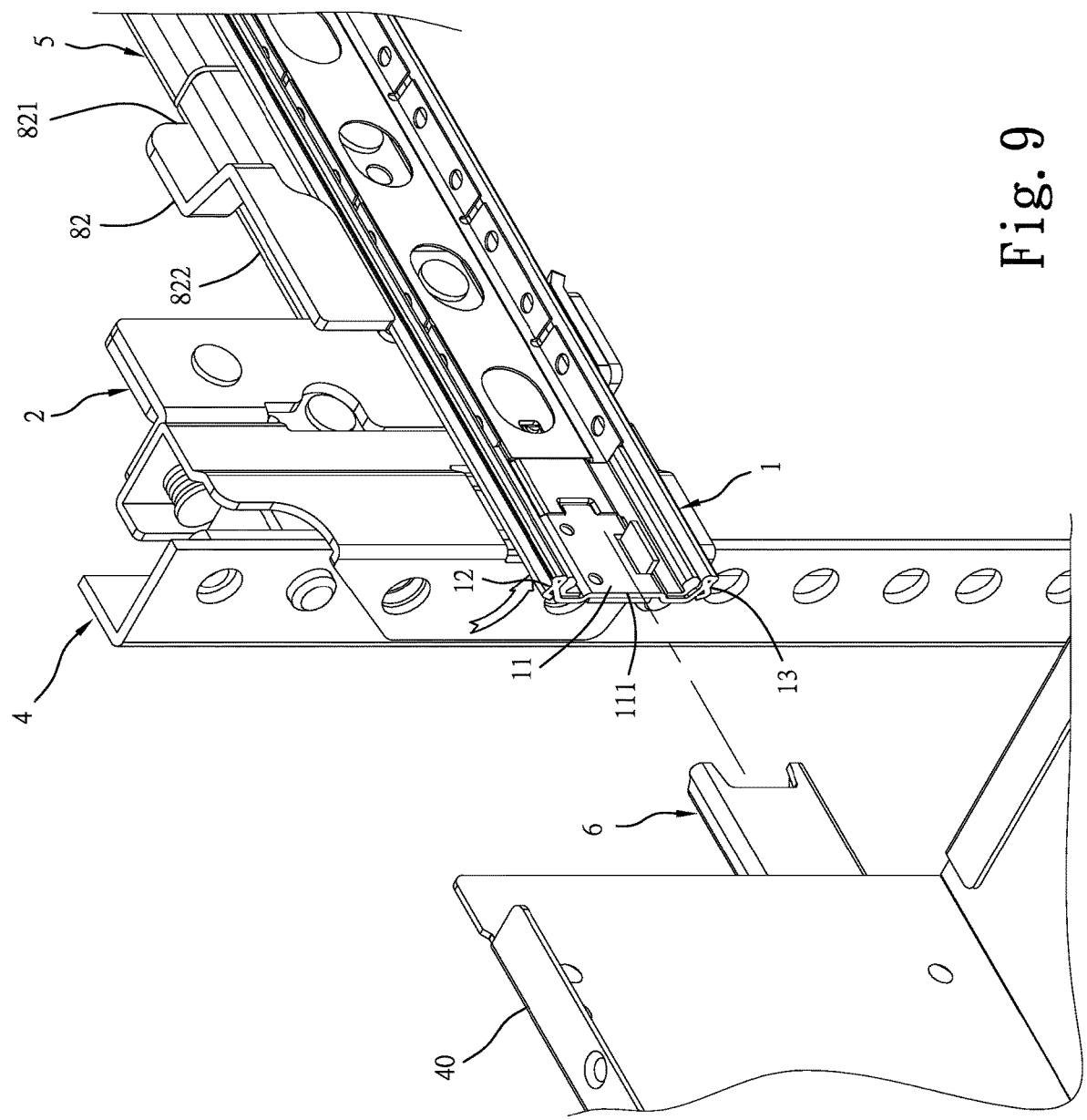
FIG. 9 is another perspective view of the mounting structure and server rack portion of FIG. 8, illustrating the outer rail pulled out for a distance after pressed the press portion of the outer rail pull-out control member and the inner sliding rail with the server box aligned with the outer rail prior to installation.
Figure 10:
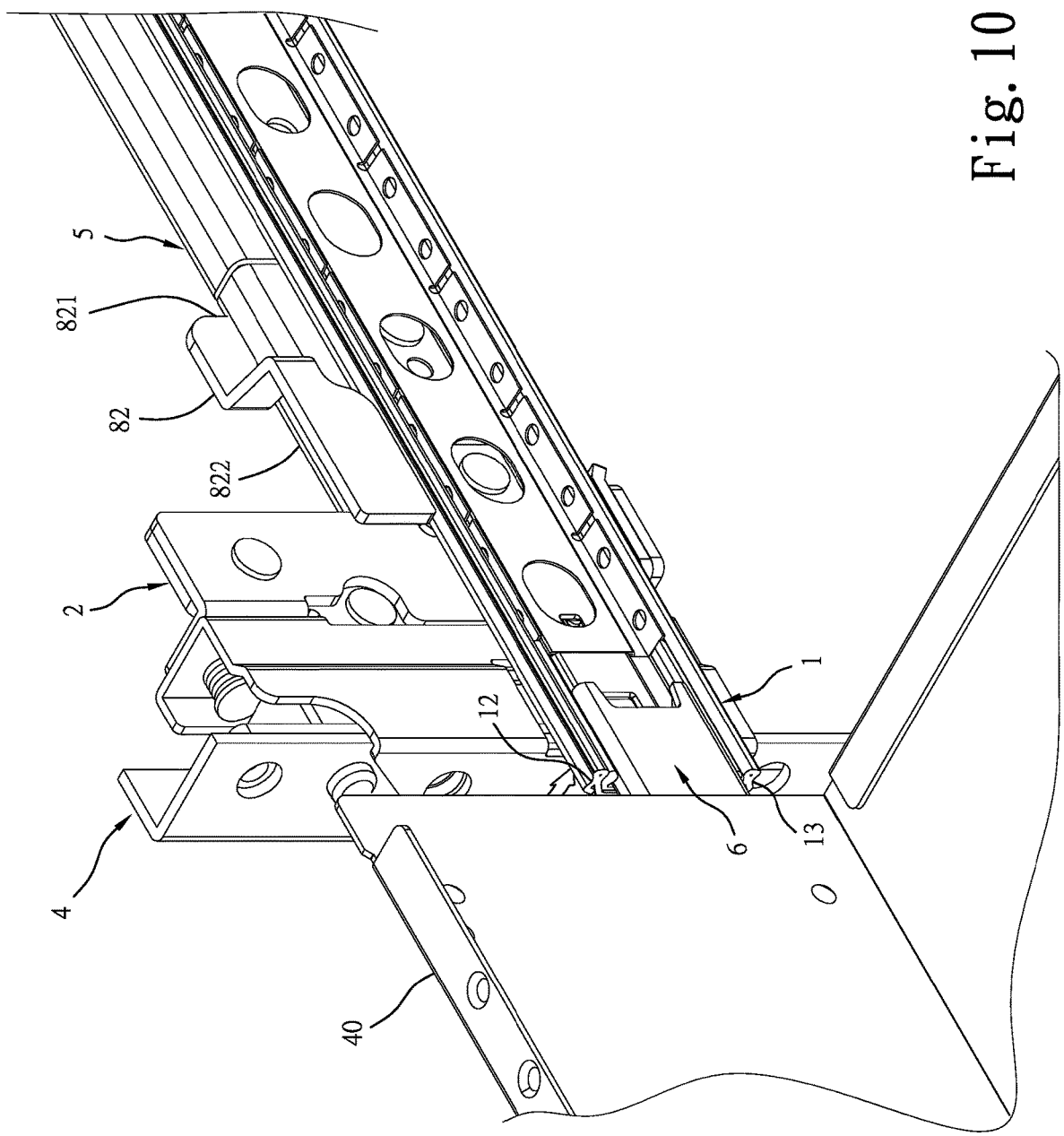
FIG. 10 generally corresponds to FIG. 9, and illustrates the inner sliding rail inserted into the outer rail.
Figure 11:
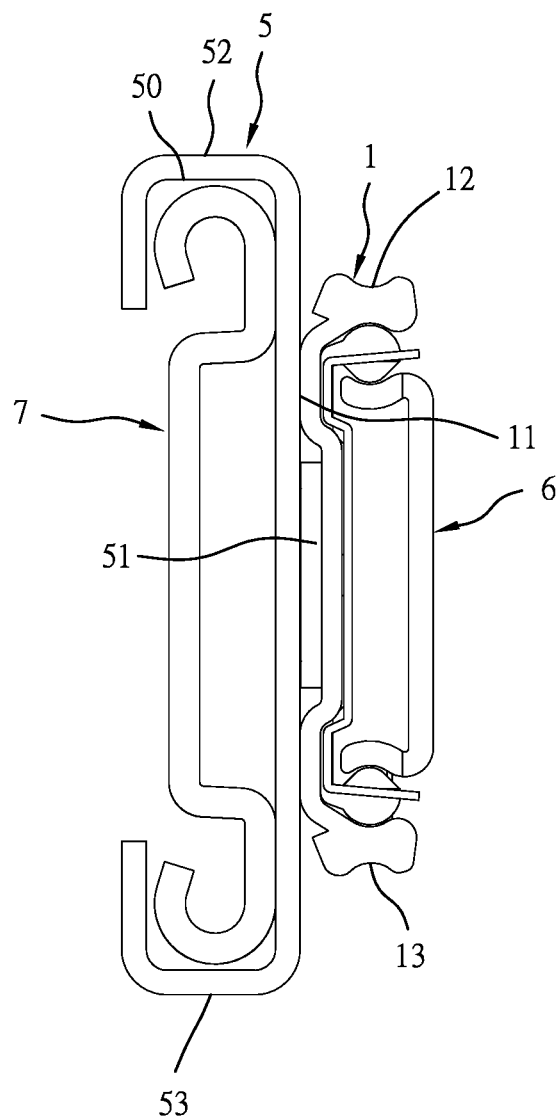
FIG. 11 is an end elevation of the inner sliding rail, the outer rail, the outer rail reinforcement rail and the front bracket auxiliary sliding rail shown in an assembled configuration.

Referring to FIGS. 2-11, a convenient two-step inner sliding rail mounting structure for server sliding rail assembly is shown. The convenient two-step inner sliding rail mounting structure for server sliding rail assembly includes an outer rail 1 mounted with opposing front and rear ends thereof to a server rack 4 through a front bracket 2 and a rear bracket 3, respectively, and further including a base wall 11, an opposing upper wall 12, and a lower wall 13 respectively extended from opposing top and bottom sides of the base wall 11. In addition, an outer rail reinforcement rail 5 includes a base wall 51 (FIG. 11) affixed to a back side of the base wall 11 of the outer rail 1, with an opposing upper wall 52 and a lower rail 53 respectively extended from opposing top and bottom sides of the base wall 51 and a sliding groove 50 longitudinally extended through opposing front and rear ends thereof (FIGS. 2 and 11). An inner sliding rail 6 (FIGS.

9-11) mounted in and slidable forwards and backwards relative to the outer rail 1 and affixed to a server box 40 (FIGS. 9 and 10).

Figure 6:
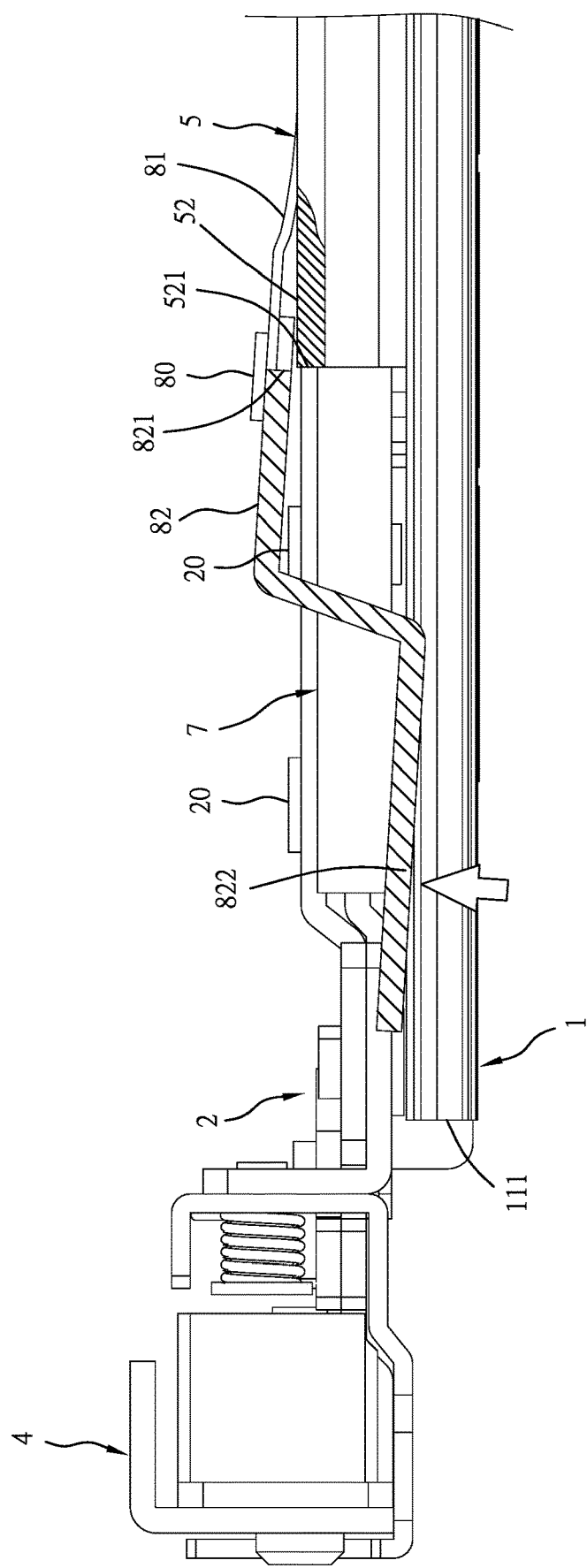
FIG. 6 generally corresponds to FIG. 5 and illustrates the press portion of the outer rail pull-out control member pressed by an external force.
Figure 7:
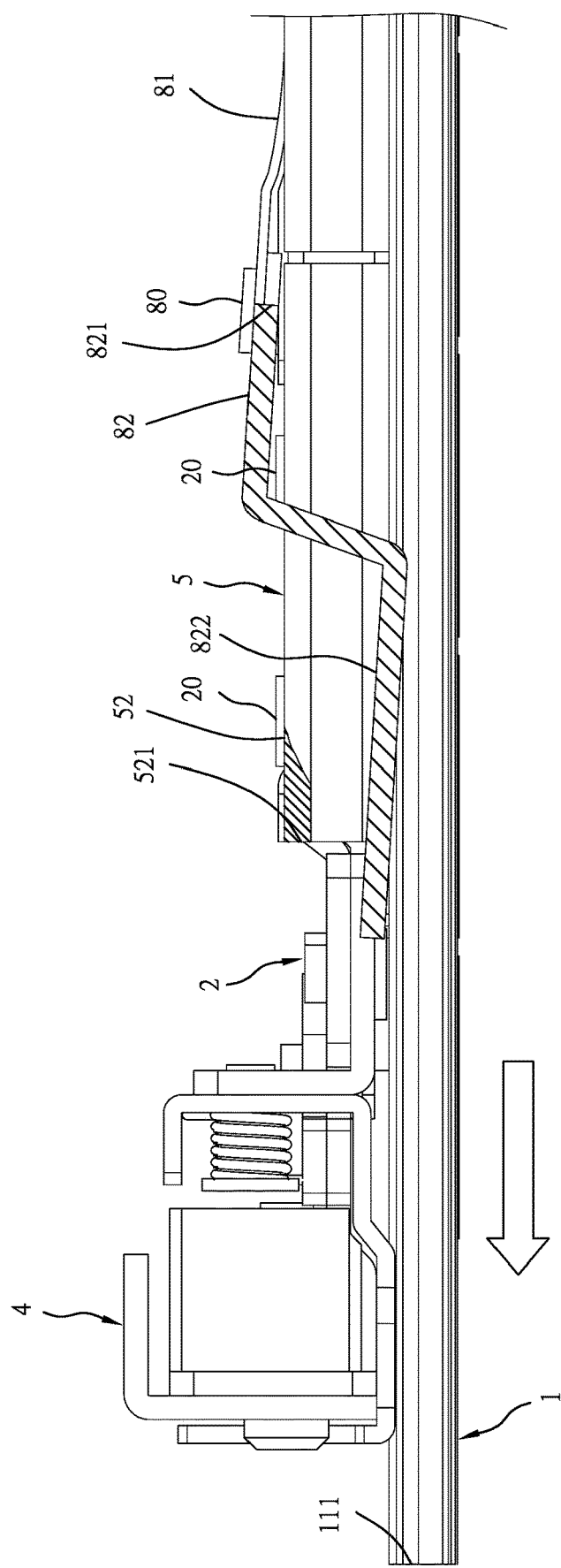
FIG. 7 generally corresponds to FIG. 6 and illustrates the outer rail pulled out for a distance after the press portion of the outer rail pull-out control member has been pressed.
Figure 8:
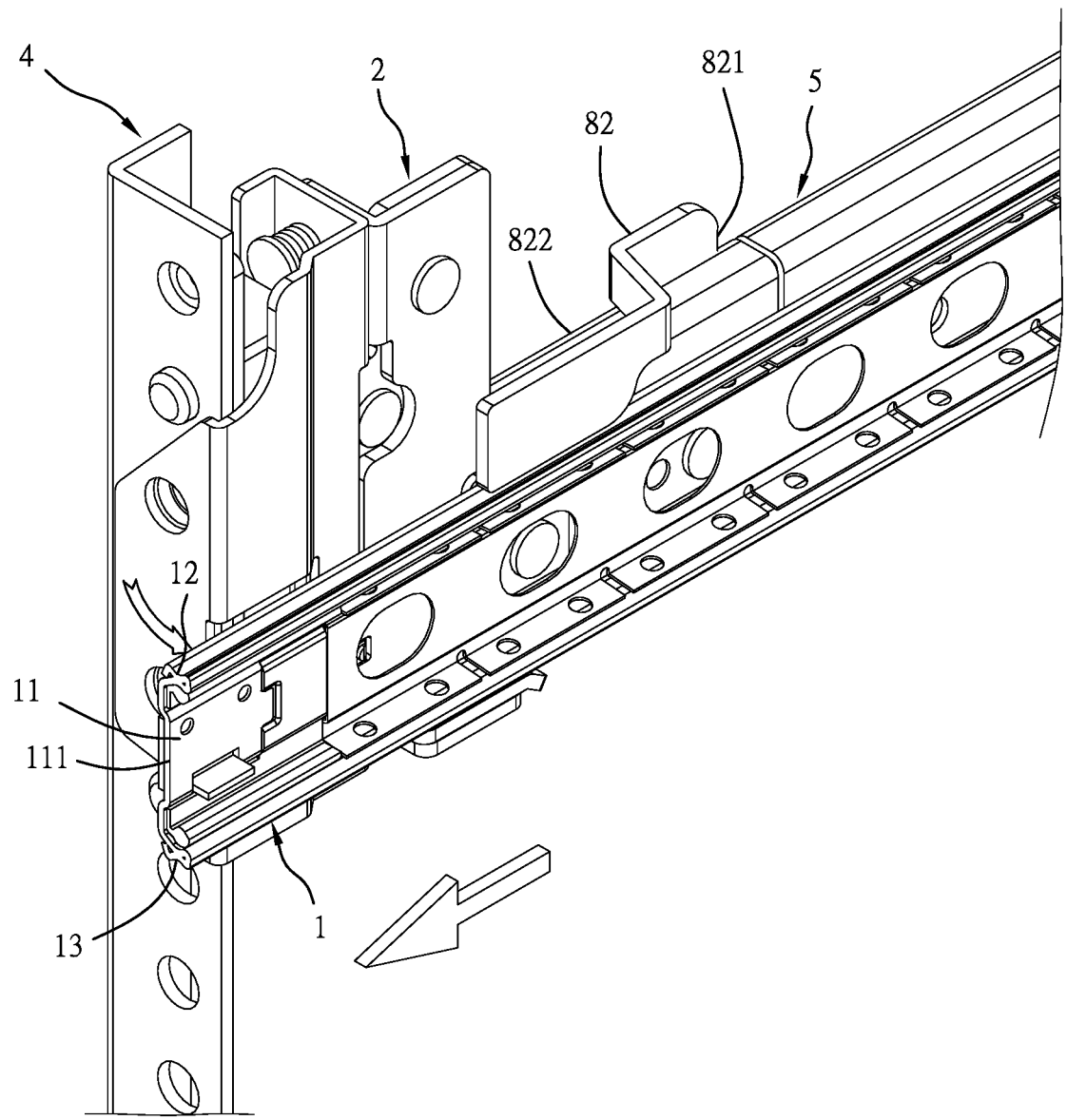
FIG. 8 is a perspective view of a portion of the mounting structure and server rack, illustrating the outer rail pulled out for a distance after pressed the press portion of the outer rail pull-out control member.

The front bracket 2 at the front end of the outer rail 1 is connected to a front end of a front bracket auxiliary sliding rail 7 with a plurality of first fastening members 20 (FIG. 2). The front bracket auxiliary sliding rail 7 has an opposing rear end thereof slidably inserted into the sliding groove 50 of the outer rail reinforcement rail 5 (FIGS. 2 and 11) so that the outer rail reinforcement rail 5 is movable back and forth relative to the front bracket auxiliary sliding rail 7 for a certain distance. Further, the rear end of the front bracket auxiliary sliding rail 7 is connected with one end of a spring plate 81 by at least one second fastening member 70 (FIG. 2). The spring plate 81 has an opposite end thereof connected with an outer rail pull-out control member 82 by at least one third fastening member 80. The outer rail pull-out control member 82 comprises a stopper portion 821 adapted for stopping against a front end 521 of the upper wall 52 of the outer rail reinforcement rail 5 (FIGS. 2, 3 and 5), and a press portion 822 connected to a front side of the stopper portion 821 (FIGS. 2 and 3) for pressing by the user to release the stopper portion 821 from the front end 521 of the upper wall 52 of the outer rail reinforcement rail 5 (FIG. 6). The press portion 822 can be actuated to allow the outer rail reinforcement rail 5 to be pulled out of the front bracket auxiliary sliding rail 7 so that the outer rail 1 can be pulled out for a distance to expose the front end 111 to the outside of the front end of the server rack 4 (FIGS. 7-9), facilitating insertion of the inner sliding rail 6 into the outer rail 1 (FIG. 10). After insertion of the inner sliding rail 6 into the outer rail 1, the inner sliding rail 6, together with the server box 40, are pushed back into the inside of the server rack 4.

Mounting the inner sliding rail 6 in the outer rail 1 is accomplished by pressing the press portion 822 of the outer rail pull-out control member 82 to thereby release the stopper portion 821 from the front end 521 of the upper wall 52 of the outer rail reinforcement rail 5 (FIG. 6). This allows the outer rail reinforcement rail 5 to be pulled out of the front bracket auxiliary sliding rail 7. Thus, the outer rail 1 is pulled out with the outer rail reinforcement rail 5 for a certain distance to expose the front end 111 to the outside of the front side of the server rack 4 (FIGS. 7-9), facilitating installation of the inner sliding rail 6 in the outer rail 1 (FIG. 10).

Although a particular embodiment of the present invention has been described in detail for purposes of illustration, various modifications and enhancements may be made without departing from the spirit and scope of the invention. Accordingly, the invention is not to be limited excepted as by the appended claims as interpreted according to the principles of patent law including the doctrine of equivalents.

The invention claimed is:

1. A convenient two-step inner sliding rail mounting structure comprises:
    an outer rail with opposing front and rear ends and configured for mounting to a server rack;
    a front bracket and a rear bracket coupled respectively to said front end and said rear end of said outer rail;
    said outer rail comprising a base wall, an opposing upper wall, and a lower wall respectively extended from opposing top and bottom sides of said base wall of said outer rail;
    an outer rail reinforcement rail comprising a base wall affixed to a back side of said base wall of said outer rail, an opposing upper wall, and a lower rail respectively extended from opposing top and bottom sides of said base wall of said outer rail reinforcement rail, and said outer rail reinforcement rail defining a sliding groove longitudinally extended through opposing front and rear ends thereof; and
    an inner sliding rail mounted in said outer rail and slidable forwards and backwards relative to said outer rail, wherein said inner sliding rail is configured to be affixed to a server box;
    a spring plate;
    a front bracket auxiliary sliding rail having a front end and an opposing rear end, wherein said opposing rear end is slidably inserted into said sliding groove so that said outer rail reinforcement rail is movable back and forth relative to said front bracket auxiliary sliding rail; and
    an outer rail pull-out control member comprising a stopper portion adapted for stopping against a front end of the upper wall of said outer rail reinforcement rail, and a press portion connected to a front side of said stopper portion and configured for pressing by a user;
    wherein said front bracket at said front end of said outer rail is connected to said front end of said front bracket auxiliary sliding rail with a plurality of first fastening members;
    wherein said rear end of said front bracket auxiliary sliding rail is connected with one end of said spring plate by at least one second fastening member, and said spring plate having an opposite end thereof connected with said outer rail pull-out control member by at least one third fastening member; and
    wherein said press portion is operable to release said stopper portion from said front end of said upper wall of said outer rail reinforcement rail for allowing said outer rail reinforcement rail to be pulled out of said front bracket auxiliary sliding rail so that said outer rail is pulled out for a distance to expose said front end of said outer rail to an outside of a front end of the server rack to permit insertion of said inner sliding rail into said outer rail.

* * * * *